United States Patent
Benelbar

(10) Patent No.: US 7,230,492 B2
(45) Date of Patent: Jun. 12, 2007

(54) ROBUST MONOLITHIC AUTOMATIC BIAS CIRCUIT WITH CURRENT SETTING APPARATUS

(75) Inventor: Rebouh Benelbar, Murphy, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 25 days.

(21) Appl. No.: 10/955,750

(22) Filed: Sep. 29, 2004

(65) Prior Publication Data

US 2006/0066405 A1    Mar. 30, 2006

(51) Int. Cl.
 *H03F 3/04* (2006.01)
(52) U.S. Cl. ...................... 330/289; 330/296
(58) Field of Classification Search .............. None
 See application file for complete search history.

(56) References Cited

U.S. PATENT DOCUMENTS

| | | | |
|---|---|---|---|
| 5,387,880 A | | 2/1995 | Kobayashi |
| 6,496,073 B2 * | | 12/2002 | Choi ........................ 330/296 |
| 6,639,470 B1 * | | 10/2003 | Andrys et al. ............. 330/296 |
| 6,788,150 B2 * | | 9/2004 | Joly et al. .................. 330/285 |

OTHER PUBLICATIONS

"A Novel Compact Monolithic Active Regulated Self-Biased InP HEMT Amplifier"; K.W. Kobayashi et al., IEEE Microwave And Guides Wave Letters, vol. 4, No. 7, Jul. 1994, pp. 238-240.
"A Monolithic HEMT Regulated Self-biased LNA", K.W. Kobayashi et al., IEEE 1994 Microwave and Millimeter-Wave Monolithic Circuits Symposium, pp. 121-134.

* cited by examiner

*Primary Examiner*—Khanh Van Nguyen
(74) *Attorney, Agent, or Firm*—Bever Hoffman

(57) ABSTRACT

A bias circuit includes a regulator circuit and a current diverting circuit. The regulator circuit includes a load resistor, a first transistor, and feedback control circuitry for biasing the first transistor such that a nominal quiescent current flows through the first resistor and first transistor. A current diverting circuit is coupled in parallel with the first transistor. When the current diverting circuit is disabled, the nominal quiescent current continues to flow through the load resistor and first transistor. When the current diverting circuit is enabled, a diverted current flows through the current diverting circuit, such that the new quiescent current through the first transistor is equal to the nominal quiescent current minus the diverted current. The value of the diverted current is also controlled by the feedback control circuitry. The quiescent current through the first transistor is used as a reference for biasing another circuit.

17 Claims, 6 Drawing Sheets

ROBUST MONOLITHIC AUTOMATIC BIAS CIRCUIT WITH CURRENT SETTING APPARATUS

FIELD OF THE INVENTION

The present invention relates to automatic bias control, temperature compensation, process variation compensation and reference tracking circuit design.

RELATED ART

Field effect transistors (FET) gate threshold voltage varies significantly from wafer to wafer. In addition, bipolar junction transistors (BJT) exhibit collector current temperature dependence. Consequently, the bias point will change with temperature and from transistor to transistor. Solutions already exist to counter these phenomena. The degree of success varies with approach complexity. For example, a simple feedback current source can provide ±20% variation around a targeted quiescent bias current. A regulated solution typically provides a ±5% deviation around a desired quiescent bias current. Both of these approaches attempt to maintain a constant quiescent bias current over temperature and process variations.

FIG. 1 is a circuit diagram 100 of a conventional regulator circuit 101 and a circuit to be biased 102. Regulator circuit 101 includes voltage source 110, resistors 120–123, capacitor 130, and operational amplifier 150. Voltage source 110 provides a regulated DC voltage $V_{REG}$ to node $N_0$. Resistors 120 and 121 are coupled between node $N_0$ and ground, thereby forming a voltage divider circuit, which provides a reference voltage $V_{REF}$ on node $N_1$. Resistors 120 and 121 have resistances of $R_0$ and $R_1$, respectively, such that the reference voltage $V_{REF}$ is equal to $V_{REG} \times R_1/(R_0+R_1)$. The reference voltage $V_{REF}$ is applied to an input terminal of operational amplifier 150. A load resistor 123, having a resistance $R_L$, is coupled between nodes $N_0$ and $N_2$, such that a voltage $V_{OUT}$ is applied to node $N_2$. This voltage $V_{OUT}$ is applied to the other input terminal of operational amplifier 150.

Operational amplifier 150 is designed to operate without saturation. The output terminal of operational amplifier 150 is coupled to node $N_3$ through resistor 122. Capacitor 130 is coupled between node $N_3$ and ground. Resistor 122 and capacitor 130 provide isolation and filtering at the output of operational amplifier 150. Operational amplifier 150 provides a control voltage $V_{GS}$ to the gate (base) of transistor Q1 (on node $N_3$). In response, a control current $I_{Q1}$ flows through transistor Q1 and load resistor 123. Operational amplifier 150 adjusts the control voltage $V_{GS}$ such that the voltage $V_{OUT}$ on node $N_2$ is equal to the reference voltage $V_{REF}$ on node $N_1$. Thus, operational amplifier 150 effectively mirrors the reference voltage $V_{REF}$ to the drain (collector) of transistor Q1. Under these conditions, the current $I_{Q1}$ is equal to $(V_{REG}-V_{REF})/R_L$, wherein $V_{REF}$ is equal to $V_{REG} \times R_1/(R_0+R_1)$. Stated another way, the current $I_{Q1}$ is equal to $(V_{REG} \times R_0/(R_0+R_1))/R_L$. Thus, by selecting the regulated voltage $V_{REG}$ and the resistances $R_0$, $R_1$ and $R_L$, the quiescent current $I_{Q1}$ through transistor Q1 is fixed, such that this current is largely independent of process and temperature variations.

The gate (base) of transistor Q1 is tapped at node $N_3$, such that the gate (base) voltage $V_{GS}$ of transistor Q1 can be used to bias other devices. Although circuit 100 provides a robust current tracking method, the quiescent current $I_{Q1}$ is undesirably set at the fixed level determined by the regulated voltage $V_{REG}$ and the resistances $R_0$, $R_1$ and $R_L$.

Other regulated self-biased amplifiers are described in more detail in the following references:

[1] K. W. Kobayashi et al., "Monolithic HEMT Regulated Self-biased LNA", IEEE MMMWC-S Dig., San-Diego, Calif., 1994.

[2] K. W. Kobayashi et al., "A Novel Compact Monolithic Active Regulated Self-biased InP HEMT Amplifier", IEEE Microwave & Guided Wave Letters, Vol. 4, No 7, July 1994.

[3] U.S. Pat. No. 5,387,880, "Compact Monolithic Wideband HEMT Low Noise Amplifiers with Regulated Self-bias" by K. W. Kobayashi.

It would therefore be desirable to provide an apparatus that offers similar performance to the regulated solution with the added benefit of selectable steady state quiescent current value.

DETAILED DESCRIPTION

Figure 1:
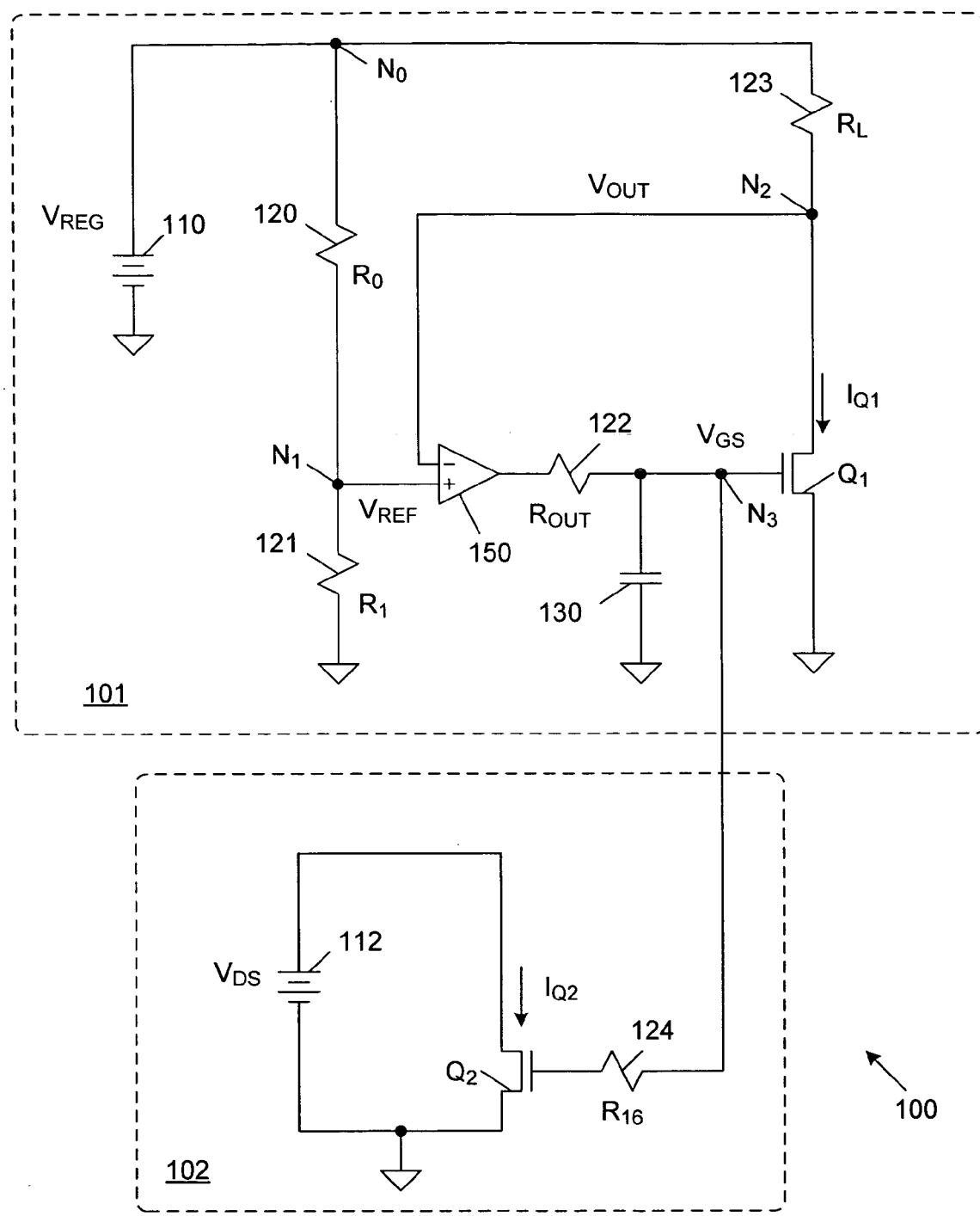
FIG. 1 is a circuit diagram of a conventional regulator circuit and a circuit that is biased by the conventional regulator circuit.
Figure 2:
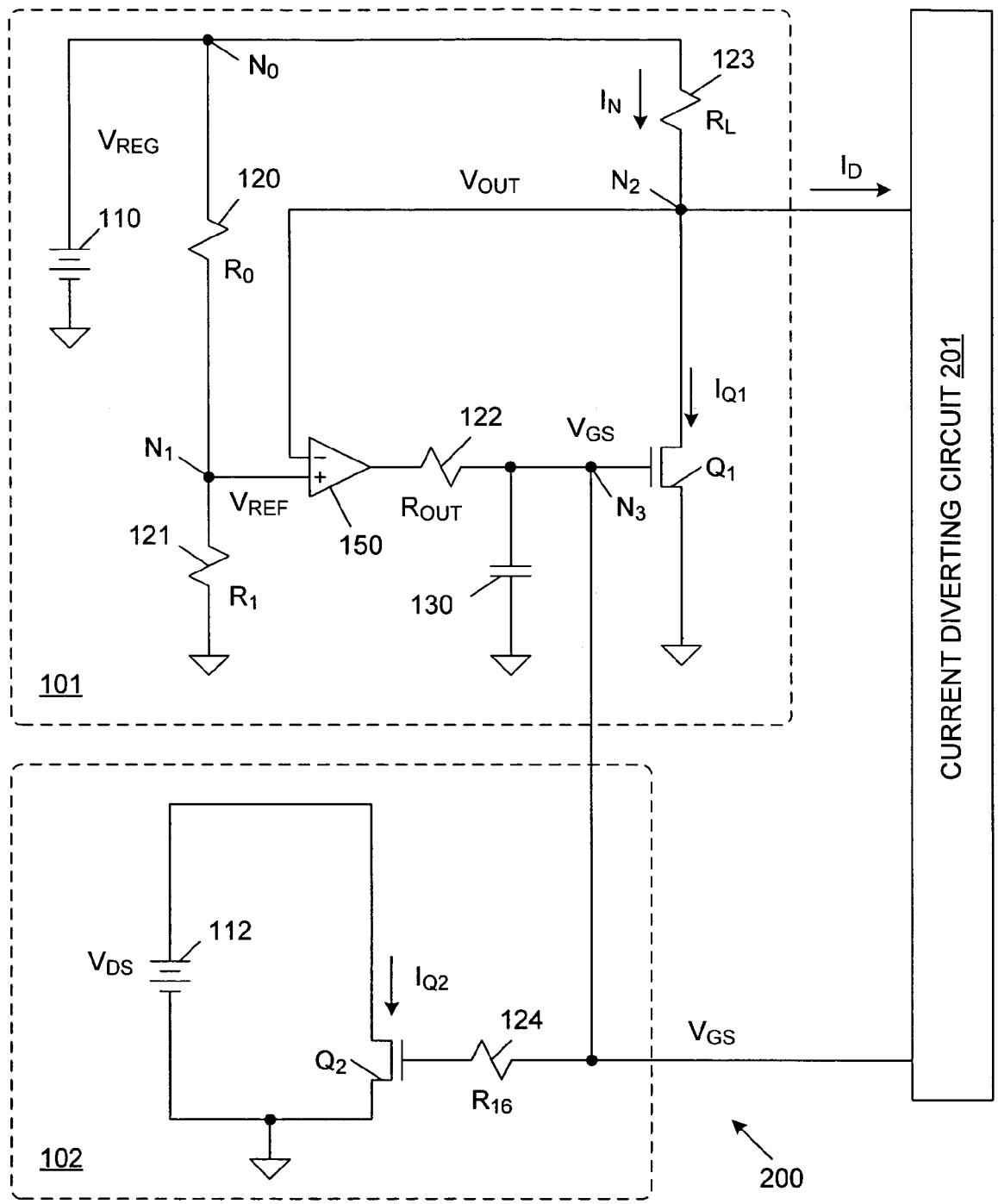
FIG. 2 is a block diagram of a current diverting circuit, which is coupled to the regulator circuit and the biased circuit of FIG. 1, in accordance with one embodiment of the present invention.

FIG. 2 is a block diagram 200 of a current diverting circuit 201, which is coupled to regulator circuit 101 and biased circuit 102, in accordance with one embodiment of the present invention. Regulator circuit 101 and biased circuit 102 have been described above in connection with FIG. 1.

Current diverting circuit 201 is coupled to terminal $N_2$, such that a diverted current $I_D$ flows into current diverting circuit 201. The quiescent bias current $I_{Q1}$ is equal to the current $I_N$ through load resistor 123 minus the diverted current $I_D$. As described in more detail below, the diverted current $I_D$ is an adjustable current, such that the quiescent bias current $I_{Q1}$ can have different values.

Current diverting circuit 201 is also coupled to receive the control voltage $V_{GS}$ from node $N_3$. Note that this control voltage would be a base-emitter voltage ($V_{BE}$) if current diverting circuit 201 implements a bipolar transistor. As described in more detail below, when current diverting circuit 201 is enabled, the control voltage $V_{GS}$ (or $V_{BE}$) is used to control the magnitude of the diverted current $I_D$.

In general, when current diverting circuit 201 is disabled, this circuit 201 does not draw any current, such that the diverted current $I_D$ is equal to zero. Under these conditions, the quiescent bias current $I_{Q1}$ is equal to the current $I_N$ flowing through load resistor 123. That is, regulator circuit 101 and biased circuit 102 operate in the manner described above in connection with FIG. 1.

However, when current diverting circuit 201 is enabled, the diverted current $I_D$ is controlled to have a positive value in response to the control voltage $V_{GS}$ (or $V_{BE}$). Under these conditions, the quiescent current $I_{Q1}$ is reduced to a value equal to $I_N$ minus the diverted current $I_D$. Note that the current $I_N$ remains the same whether current diverting circuit 201 is enabled or disabled. In the foregoing manner, the quiescent current $I_{Q1}$ can have at least two selectable values. As described in more detail below, the diverted current $I_D$ can be selected to have one or more predetermined values between $I_N$ and zero.

Note that current diverting circuit 201 sets the steady state value of the quiescent current $I_{Q1}$, while regulating circuit 101 controls the dynamic (transitory) value of the quiescent current $I_{Q1}$ by canceling temperature and process variations. During steady state conditions, operational amplifier 150 maintains the reference voltage $V_{REF}$ equal to $(V_{REG} - R_L \times I_N)$.

Figure 3:
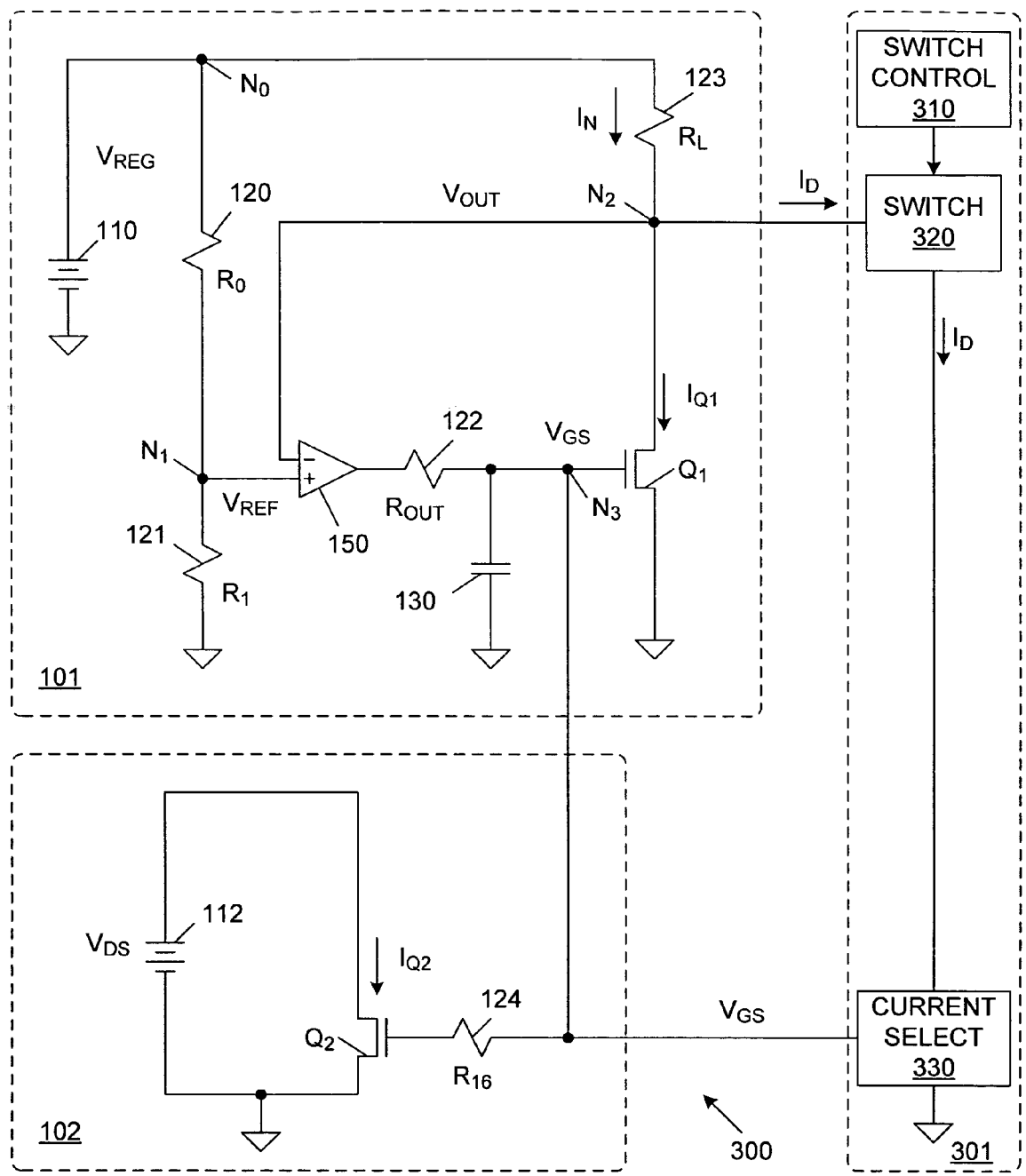
FIG. 3 is a block diagram of the current diverting circuit of FIG. 2, in accordance with one embodiment of the present invention.

FIG. 3 is a block diagram 300 of a current diverting circuit 301, which is coupled to regulator circuit 101 and biased circuit 102, in accordance with one embodiment of the present invention. Regulator circuit 101 and biased circuit 102 have been described above in connection with FIG. 1. Current diverting circuit 301 includes switch control circuit 310, switch 320 and current select circuit 330.

Switch control circuit 310 controls switch 320, such that this switch 320 is either enabled (closed) or disabled (open). When switch 320 is disabled, node $N_2$ is effectively decoupled from current select circuit 330. Under these conditions, the diverted current $I_D$ is equal to zero, and the quiescent current $I_{Q1}$ is equal to $I_N$.

Conversely, when switch 320 is enabled, node $N_2$ is coupled to current select circuit 330. Under these conditions, current select circuit 330 draws a current ($I_D$) in response to the control voltage $V_{GS}$ (or $V_{BE}$) on node $N_3$. As a result, the quiescent current $I_{Q1}$ is reduced to a value equal to $I_N$ minus the diverted current $I_D$.

Figure 4:
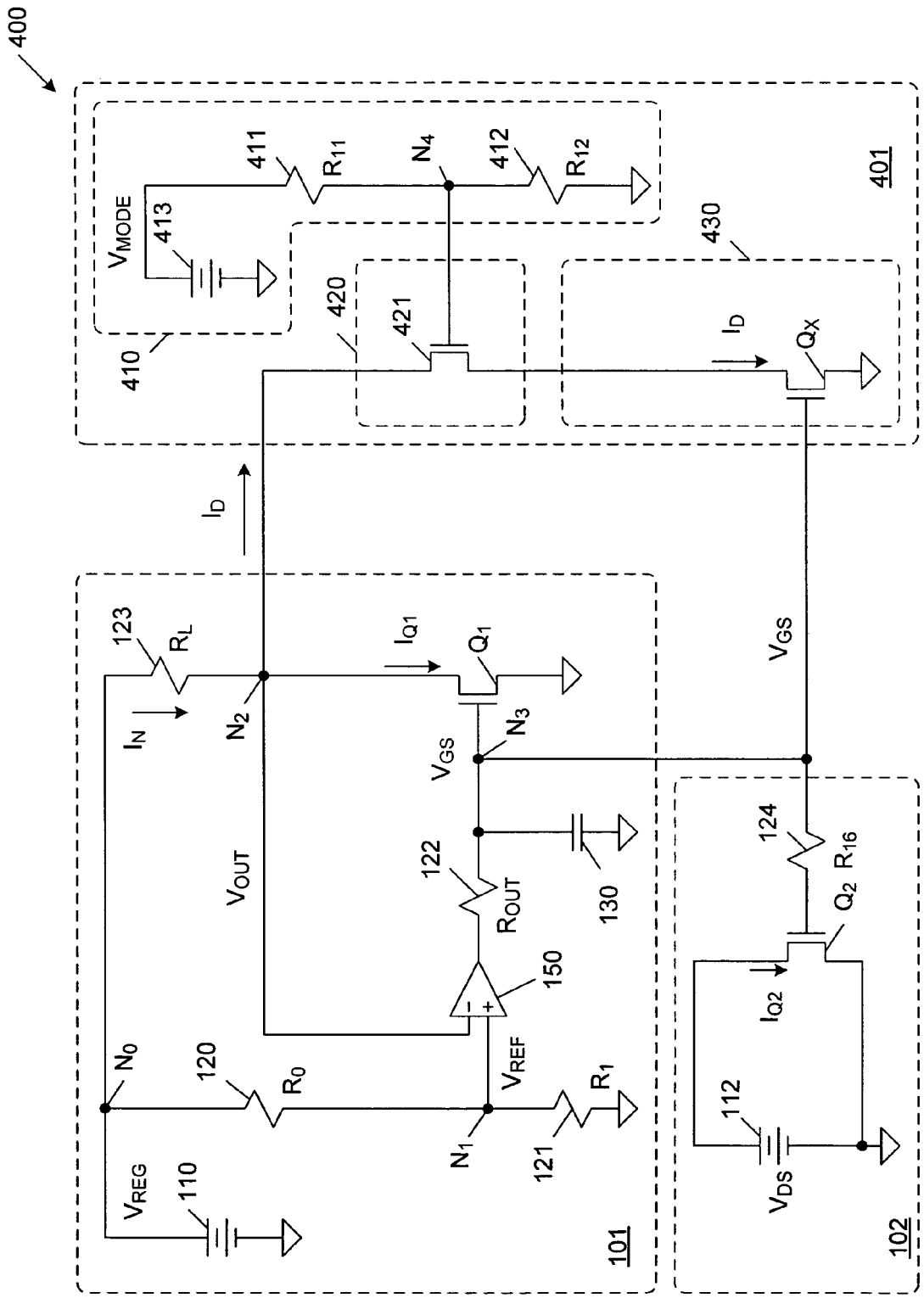
FIG. 4 is a circuit diagram illustrating a current diverting circuit having a switch control circuit, a switch and a current select circuit, in accordance with a particular embodiment of the present invention.

FIG. 4 is a circuit diagram 400 illustrating a current diverting circuit 401 having a switch control circuit 410, a switch 420 and a current select circuit 430 in accordance with a particular embodiment of the present invention. Switch control circuit 410 includes resistors 411–412 and adjustable voltage supply 413. Resistors 411 and 412 exhibit resistances $R_{11}$ and $R_{12}$, respectively. Adjustable voltage supply 413 provides an adjustable output voltage $V_{MODE}$. Resistor 411 is connected between adjustable voltage supply 413 and node $N_4$; and resistor 412 is connected between node $N_4$ and ground. Thus, a voltage divider circuit is formed, wherein the voltage on node $N_4$ is equal to $V_{MODE} \times R_{12}/(R_{11}+R_{12})$.

Switch 420 includes a transistor 421, which has a drain (collector) coupled to node $N_2$ and a gate (base) coupled to node $N_4$. Current select circuit 430 includes transistor $Q_X$. The source (emitter) of transistor 421 is coupled to the drain (collector) of transistor $Q_X$ in current select circuit 430. The source (emitter) of transistor $Q_X$ is coupled to ground; and the gate (base) of transistor $Q_X$ is coupled to receive the control voltage $V_{GS}$ (or $V_{BE}$) from node $N_3$.

In the described embodiment, transistor 421 turns on when the voltage between node $N_4$ and the source (emitter) of transistor 421 exceeds the threshold voltage $V_T$. Thus, transistor 421 turns on when the voltage $V_{MODE}$ is large enough to impose the required voltage $V_{ON}$ on node $N_4$. When the voltage on node $N_4$ is less than $V_{ON}$, transistor 421 is disabled, such that the diverted current $I_D$ is approximately equal to zero.

When transistor 421 is turned on, the diverted current $I_D$ is controlled by the voltage $V_{GS}$ (or $V_{BE}$) on node $N_3$. Thus, transistors $Q_1$ and $Q_X$ are biased in the same manner. That is, the gates (bases) of transistors $Q_1$ and $Q_X$ are both biased by $V_{GS}$ (or $V_{BE}$), the sources (emitters) of transistors $Q_1$ and $Q_X$ are both coupled to ground, and the drains (collectors) of transistors $Q_1$ and $Q_X$ are both biased by the voltage $V_{OUT}$ on node $N_2$. The currents $I_{Q1}$ and $I_D$ are therefore determined by the relative sizes (widths) of transistors $Q_1$ and $Q_X$. For example, if transistors $Q_1$ and $Q_X$ are identical, then the currents $I_{Q1}$ and $I_D$ are almost equal. Thus, the bias current $I_{Q1}$ has a value of $I_N$ when current diverting circuit 401 is disabled, and a value of $I_N/2$ when current diverting circuit 401 is enabled. In general, if transistor $Q_X$ size is M times the size of transistor $Q_1$, then the bias current $I_{Q1}$ has a value of $I_N/(M+1)$ when current diverting circuit 401 is enabled.

The bias current $I_{Q1}$ is mirrored to the biased circuit 102 as the current $I_{Q2}$. Advantageously, the quiescent value of the bias current $I_{Q1}$ (and therefore $I_{Q2}$), is selected to have one of two values in response to current diverting circuit 401.

Figure 5:
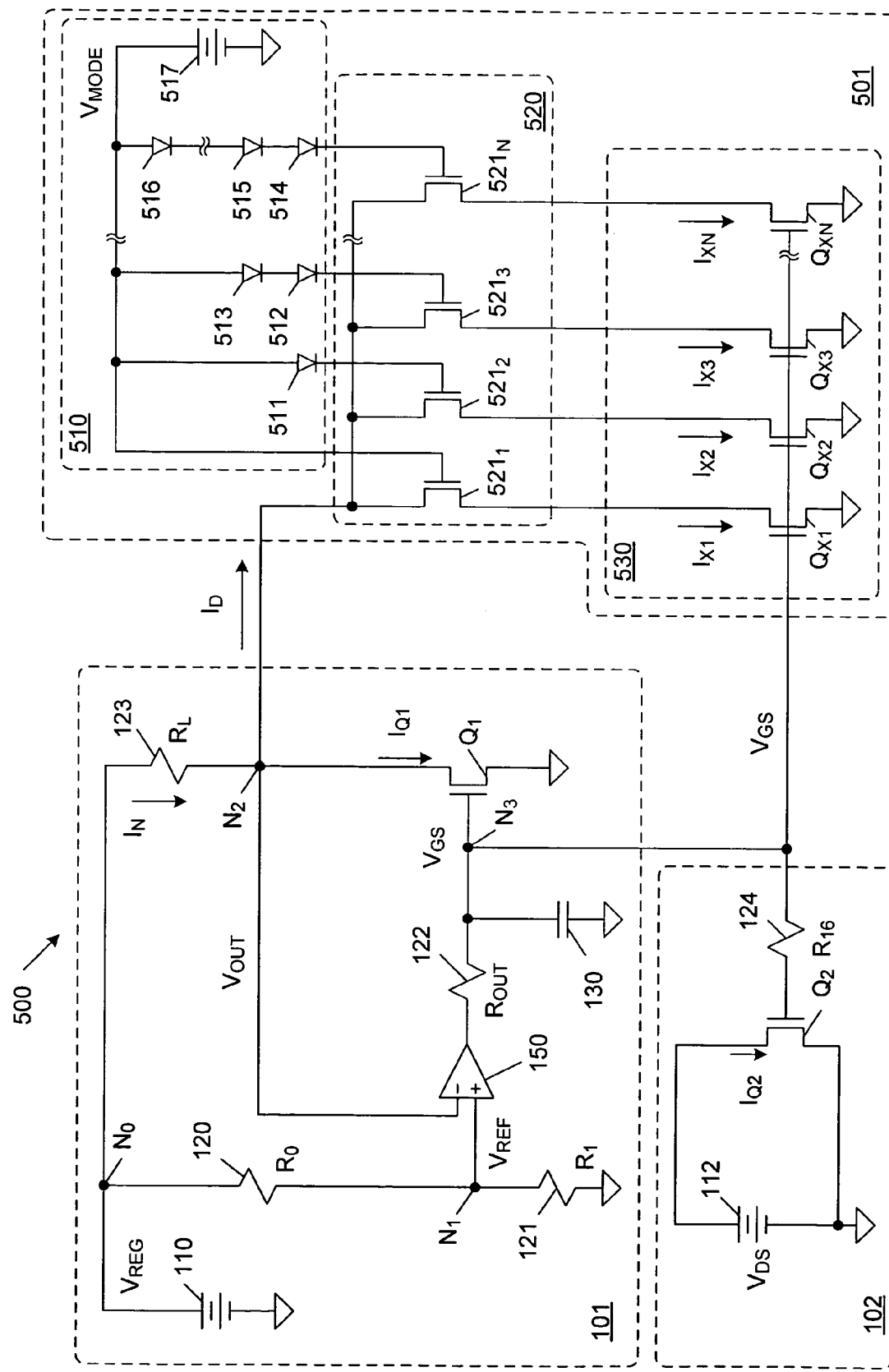
FIG. 5 is a circuit diagram illustrating a current diverting circuit in accordance with another embodiment of the present invention.

FIG. 5 is a circuit diagram 500 illustrating a current diverting circuit 501 having a switch control circuit 510, a switch 520 and a current select circuit 530 in accordance with another embodiment of the present invention. Switch control circuit 510 includes diodes 511–516 and adjustable voltage supply 517, which provides an adjustable output voltage $V_{MODE}$. Switch 520 includes transistors $521_1$–$521_N$. Current select circuit 530 includes transistors $Q_{X1}$–$Q_{XN}$.

The gate (base) of each transistor $521_X$ is coupled to receive the output voltage $V_{MODE}$ through X–1 level shifters (in present example, diodes are used, however in other embodiments, source/emitter follower can be used), wherein X is an integer between 1 and N. Thus, the gate (base) of transistor $521_1$ is directly coupled to receive the output voltage $V_{MODE}$; the gate (base) of transistor $521_2$ is coupled to receive the output voltage $V_{MODE}$ through one forward-biased diode 511; the gate (base) of transistor $521_2$ is coupled to receive the output voltage $V_{MODE}$ through two forward biased diodes 512–513; and the gate (base) of transistor $521_N$ is coupled to receive the output voltage $V_{MODE}$ through N–1 forward biased diodes 514–516. The drains (collectors) of transistors $521_1$–$521_N$ are commonly coupled to node $N_2$.

The sources (emitters) of transistors $521_1$–$521_N$ are coupled to drains of transistors $Q_{X1}$–$Q_{XN}$. The sources (emitters) of transistors $Q_{X1}$–$Q_{XN}$ are coupled to ground. The gates (bases) of transistors $Q_{X1}$–$Q_{XN}$ are commonly coupled to receive the control voltage $V_{GS}$ (or $V_{BE}$) from node $N_3$.

The voltage $V_{MODE}$ at which transistor $521_X$ turns on can be defined as $V_{ON}+(X-1) \times V_D$, where X is an integer between 1 and N, $V_{ON}$ is the necessary voltage to turn on the transistor $521_X$, and $V_D$ is a diode forward bias threshold voltage. Thus, transistor 521 turns on when the voltage $V_{MODE}$ exceeds $V_{ON}$, and transistor $521_3$ turns on when the voltage $V_{MODE}$ exceeds $V_{ON}+2V_D$.

When the voltage $V_{MODE}$ is less than $V_{ON}$, all of transistors $521_1$–$521_N$ are disabled, such that the diverted current $I_D$ is approximately equal to zero. Transistors $Q_1$, $Q_{X1}$, $Q_{X2}$, $Q_{X3}$, . . . $Q_{XN}$ have gate widths $W_1$, $W_{X1}$, $W_{X2}$, $W_{X3}$, . . . $W_{XN}$, respectively. The diverted current $I_D$ increases, and the steady state quiescent current $I_{Q1}$ decreases, as the adjustable voltage $V_{MODE}$ increases. Table 1 below defines values of the diverted current $I_D$ for various values of the $V_{MODE}$ voltage. Table 2 below defines values of the steady state quiescent current $I_{Q1}$ for various values of the $V_{MODE}$ voltage.

TABLE 1

| $V_{MODE}$ | $I_D$ |
|---|---|
| $V_{MODE} < V_{ON}$ | 0 |
| $V_{ON} < V_{MODE} < V_{ON} + V_D$ | $I_N/(1 + W_{X1}/W_1)$ |
| $V_{ON} + V_D < V_{MODE} < V_{ON} + 2V_D$ | $I_N/(1 + (W_{X1} + W_{X2})/W_1)$ |
| $V_{ON} + 2V_D < V_{MODE} < V_{ON} + 3V_D$ | $I_N/(1 + (W_{X1} + W_{X2} + W_{X3})/W_1)$ |
| $V_{ON} + (N-1) V_D < V_{MODE}$ | $I_N/(1 + (W_{X1} + W_{X2} + W_{X3} + \ldots W_{XN})/W_1)$ |

TABLE 2

| $V_{MODE}$ | $I_{Q1}$ |
|---|---|
| $V_{MODE} < V_{ON}$ | $I_N$ |
| $V_{ON} < V_{MODE} < V_{ON} + V_D$ | $I_N/(1 + W_1/W_{X1})$ |
| $V_{ON} + V_D < V_{MODE} < V_{ON} + 2V_D$ | $I_N/(1 + W_1/(W_{X1} + W_{X2}))$ |
| $V_{ON} + 2V_D < V_{MODE} < V_{ON} + 3V_D$ | $I_N/(1 + W_1/(W_{X1} + W_{X2} + W_{X3}))$ |
| $V_{ON} + (N-1) V_D < V_{MODE}$ | $I_N/(1 + W_1/(W_{X1} + W_{X2} + W_{X3} + \ldots W_{XN}))$ |

Thus, as the adjustable voltage $V_{MODE}$ increases, more of transistors $Q_{X1}$–$Q_{XN}$ are turned on, thereby increasing the diverted current $I_D$. When transistors $Q_{X1}$–$Q_{XN}$ are turned on, these transistors are connected in parallel with transistor $Q_1$, such that these transistors $Q_{X1}$–$Q_{XN}$ and $Q_1$ are biased in the same manner. That is, the gates (bases) of transistors $Q_{X1}$–$Q_{XN}$ and $Q_1$ are all biased by the control voltage $V_{GS}$ (or $V_{BE}$). As a result, the magnitude of the diverted current $I_D$ through transistors $Q_{X1}$–$Q_{XN}$ and the magnitude of the bias current $I_{Q1}$ through transistor Q1 are determined by the relative sizes of transistors $Q_{X1}$–$Q_{XN}$ and $Q_1$. See, e.g., Tables 1 and 2.

The bias current $I_{Q1}$ is mirrored to the biased circuit 102 as the current $I_2$. Advantageously, the quiescent value of the bias current $I_{Q1}$ (and therefore $I_{Q2}$), is selected to have one of (N+1) values in response to current diverting circuit 501.

Figure 6:
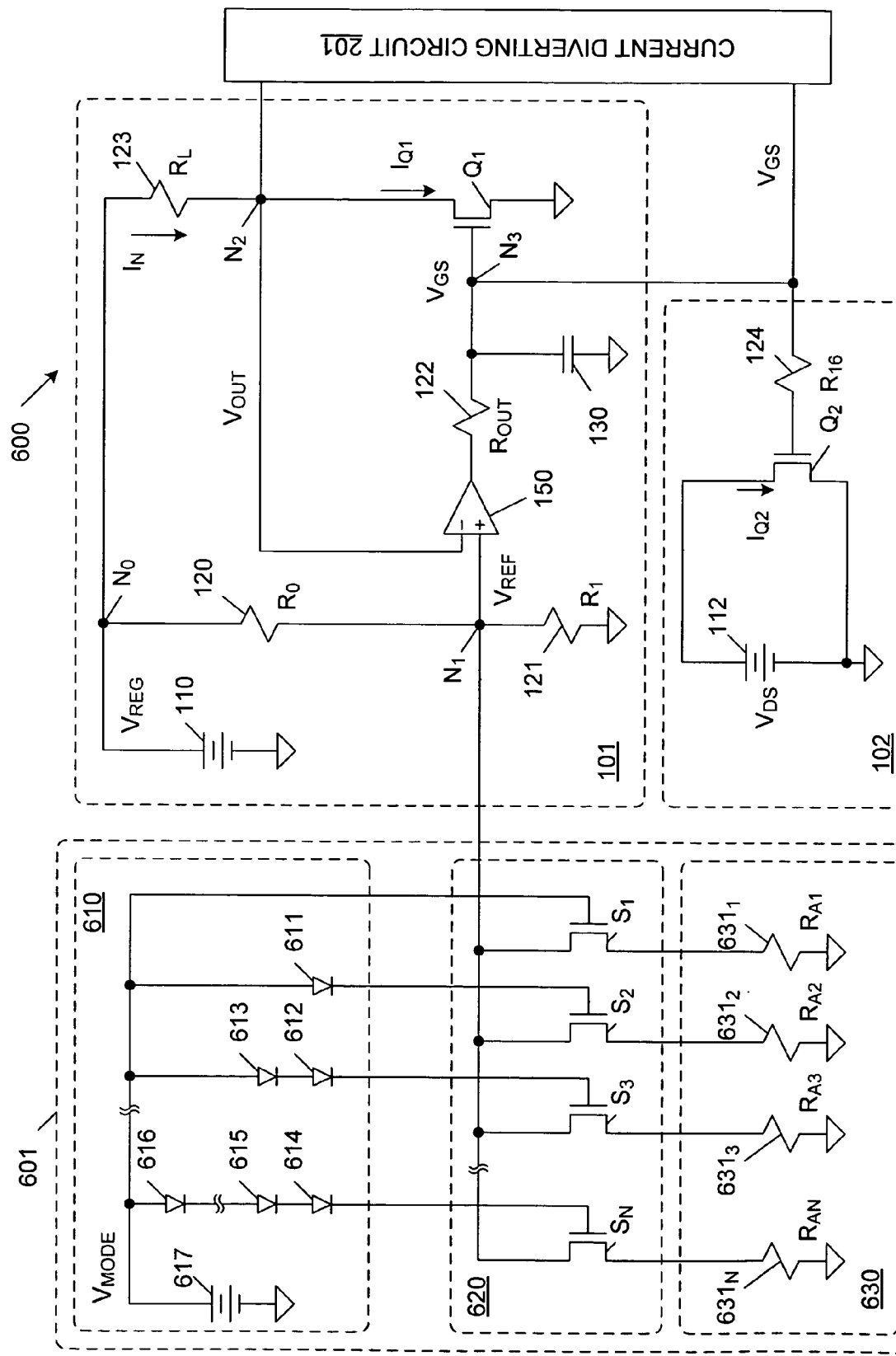
FIG. 6 is a circuit diagram illustrating a bias control circuit having a switch control circuit, a switch circuit and a resistance select circuit in accordance with another embodiment of the present invention.

FIG. 6 is a circuit diagram 600 illustrating a bias control circuit 601 having a switch control circuit 610, a switch circuit 620 and a resistance select circuit 630 in accordance with another embodiment of the present invention. Switch control circuit 610 includes level shifters (diodes or a source/emitter follower) 611–616 and adjustable voltage supply 617, which provides an adjustable output voltage $V_{MODE}$. Switch circuit 620 includes transistors $S_1$–$S_N$. Resistance select circuit 630 includes resistors $631_1$–$631_N$, which have resistances $R_{A1}$–$R_{AN}$, respectively. The on-resistances of transistors $S_1$–$S_N$ are negligible when compared with the resistances $R_{A1}$–$R_{AN}$.

The gate (base) of each transistor $S_X$ is coupled to receive the output voltage $V_{MODE}$ through X–1 diodes, wherein X is an integer between 1 and N. Thus, the gate of transistor $S_1$ is directly coupled to receive the output voltage $V_{MODE}$; the gate of transistor $S_2$ is coupled to receive the output voltage $V_{MODE}$ through one forward-biased diode 611; the gate of transistor $S_2$ is coupled to receive the output voltage $V_{MODE}$ through two forward biased diodes 612–613; and the gate of transistor $S_N$ is coupled to receive the output voltage $V_{MODE}$ through N–1 forward biased diodes 614–616. The sources (emitters) of transistors $S_1$–$S_N$ are coupled to resistors $631_1$–$631_N$ respectively, and the drains (collectors) of transistors $S_1$–$S_N$ are commonly coupled to node $N_1$. Resistors $631_1$–$631_N$ are further commonly coupled to ground.

The voltage $V_{MODE}$ at which transistor $S_X$ turns on can be defined as $V_{ON}+(X-1)\times V_D$, where X is an integer between 1 and N, $V_{ON}$ is the necessary voltage to turn on the transistor $S_X$, and $V_D$ is a diode forward bias threshold voltage. Thus, transistor $S_1$ turns on when the voltage $V_{MODE}$ exceeds $V_{ON}$, and transistor $S_3$ turns on when the voltage $V_{MODE}$ exceeds $V_{ON}+2V_D$.

When the voltage $V_{MODE}$ is less than $V_{ON}$, all of transistors $S_1$–$S_N$ are disabled, such that the reference voltage $V_{REF}$ applied to node $N_1$ is unaffected by bias control circuit 601. That is, the reference voltage $V_{REF}$ is equal to $V_{REG} \times R_1/(R_0+R_1)$. When the voltage $V_{MODE}$ is greater than $V_{ON}$, one or more of the transistors $S_1$–$S_N$ is enabled, the effective resistance between node $N_1$ and ground is reduced, such that the reference voltage $V_{REF}$ on node $N_1$ is reduced. Because the reduced reference voltage $V_{REF}$ is mirrored to node $N_2$ as the output voltage $V_{OUT}$, the resulting current $I_N$ (which is equal to $(V_{REG}-V_{OUT})/R_L$) is increased. As the current $I_N$ increases, the steady state quiescent current $I_{Q1}$ increases. Table 3 below defines values of the steady state quiescent current $I_N$ for various values of the $V_{MODE}$ voltage.

TABLE 3

| $V_{MODE}$ | $I_N$ |
|---|---|
| $V_{MODE} < V_{ON}$ | $(V_{REG} \times R_0/(R_0 + R_1))/R_L$ |
| $V_{ON} < V_{MODE} < V_{ON} + V_D$ | $(V_{REG} \times R_0/(R_0 + 1/(1/R_1 + 1/R_{A1})))/R_L$ |
| $V_{ON} + V_D < V_{MODE} < V_{ON} + 2V_D$ | $(V_{REG} \times R_0/(R_0 + 1/(1/R_1 + 1/R_{A1} + 1/R_{A2})))/R_L$ |
| $V_{ON} + 2V_D < V_{MODE} < V_{ON} + 3V_D$ | $(V_{REG} \times R_0/(R_0 + 1/(1/R_1 + 1/R_{A1} + 1/R_{A2} + 1/R_{A3})))/R_L$ |
| $V_{ON} + (N-1) V_D < V_{MODE}$ | $(V_{REG} \times R_0/(R_0 + 1/(1/R_1 + 1/R_{A1} + 1/R_{A2} + 1/R_{A3} + \ldots 1/R_{AN})))/R_L$ |

Thus, as the adjustable voltage $V_{MODE}$ increases, more of transistors $S_1$–$S_N$ are turned on, thereby reducing the resistance between node $N_1$ and ground. This reduced resistance increases the voltage drop across the load resistance $R_L$, thereby increasing the current $I_N$ (and the associated steady state quiescent current $I_{Q1}$). In the foregoing manner, bias control circuit 601 can be used to adjust the steady state quiescent current $I_{Q1}$. Note that bias control circuit 601 can be used independent of the above-described current diverting circuits or in combination with these above-described current diverting circuits.

The present invention combines two major advantages, namely: (1) the steady state quiescent current $I_{Q1}$ can be set independent of the control loop present in regulator circuit 101, and (2) closed loop regulation is used, thereby providing optimal immunity to process and temperature variations.

The present invention can be used virtually in any design that requires quiescent point immunity to temperature and process variation, and at the same time allows the possibility to set the quiescent point. The present invention is particularly useful to provide a versatile bias scheme for multi-mode power amplifiers.

Although the invention has been described in connection with several embodiments, it is understood that this invention is not limited to the embodiments disclosed, but is capable of various modifications, which would be apparent to one of ordinary skill in the art. For example, although the above-described examples use field effect transistors, it is understood that field effect transistors can be replaced with bipolar junction transistors (BJTs) in other embodiments. Moreover, although the present invention is described as implementing enhancement-type transistors, it is understood that the present invention can also be implemented using depletion-type transistors. Note that operational amplifier 150 can be configured to provide a positive or negative output voltage $V_{GS}$, thereby allowing the invention to be used with depletion mode or enhancement mode transistors (including bipolar RF transistors). Accordingly, the present invention is limited only by the following claims.

I claim:

1. A bias circuit comprising:
   a regulator circuit having a first resistive element coupled to a first transistor, and control circuitry for biasing the first transistor such that a nominal quiescent current flows through the first resistive element; and
   a current diverting circuit coupled in parallel with the first transistor, wherein the current diverting circuit is adapted to operate in a disabled state and an enabled state, wherein a first quiescent current flows through the first transistor and a first diverted current flows through the current diverting circuit in the disabled state, and a second quiescent current flows through the first transistor and a second diverted current flows through the current diverting circuit in the enabled state.

2. The bias circuit of claim 1, wherein the first diverted current is negligible, such that the first quiescent current is approximately equal to the nominal quiescent current.

3. The bias circuit of claim 1, wherein the second diverted current is larger than the first diverted current.

4. The bias circuit of claim 1, wherein the current diverting circuit comprises:
   a switch circuit;
   a switch control circuit coupled to the switch circuit; and
   a current select circuit coupled in parallel with the first transistor through the switch circuit.

5. The bias circuit of claim 4, wherein the current select circuit is coupled to the control circuitry of the regulator circuit, such that the current select circuit and the first transistor are commonly biased.

6. The bias circuit of claim 5, wherein the current select circuit comprises a second transistor, wherein gates of the first and second transistors are commonly biased.

7. The bias circuit of claim 6, wherein the current select circuit further comprises a third transistor, wherein gates of the first, second and third transistors are commonly biased.

8. The bias circuit of claim 4, wherein the switch circuit comprises one or more transistors.

9. The bias circuit of claim 4, wherein the switch control circuit comprises an adjustable voltage source coupled to the switch circuit.

10. The bias circuit of claim 9, wherein the switch control circuit further comprises one or more level shifters coupling the adjustable voltage source to the switch circuit.

11. The bias circuit of claim 9, wherein the switch control circuit further comprises a voltage divider circuit coupling the adjustable voltage source to the switch circuit.

12. The bias circuit of claim 1, wherein the sum of the first quiescent current and the first diverted current is equal to the nominal quiescent current, and the sum of the second quiescent current and the second diverted current is equal to the nominal quiescent current.

13. A method of biasing a circuit, comprising:
   biasing a first resistive element and a first transistor using a feedback configuration, such that a first quiescent current flows through the first resistive element and the first transistor in a disabled state;
   diverting current from the first transistor, such that the first quiescent current continues to flow through the first resistive element, and a second quiescent current, less than the first quiescent current, flows through the first transistor in enabled state; and
   biasing a circuit based on whether the first quiescent current or the second quiescent current is flowing through the first transistor.

14. The method of claim 13, further comprising diverting current from the first transistor, such that the first quiescent current continues to flow through the first resistive element, and a third quiescent current, less than the second quiescent current, flows through the first transistor in a third state.

15. The method of claim 13, wherein the step of diverting current comprises:
   coupling a second transistor in parallel with the first transistor; and
   commonly biasing the first and second transistors.

16. The method of claim 15, further comprising:
   coupling a third transistor in parallel with the first and second transistors; and
   commonly biasing the first, second and third transistors.

17. The method of claim 15, further comprising selecting relative sizes of the first and second transistors to select the first and second quiescent currents.

* * * * *